(12) United States Patent
Nowak (10) Patent No.: US 11,917,835 B2
(45) Date of Patent: Feb. 27, 2024

(54) THREE-DIMENSIONAL FUNNEL-LIKE SPIN TRANSFER TORQUE MRAM CELL WITH A NON-UNIFORM THICKNESSES IN EACH LAYER

(71) Applicant: International Business Machines Corporation, Armonk, NY (US)

(72) Inventor: Janusz Jozef Nowak, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 17/128,834

(22) Filed: Dec. 21, 2020

(65) Prior Publication Data

US 2022/0199687 A1    Jun. 23, 2022

(51) Int. Cl.
*H10B 61/00* (2023.01)
*H10N 50/10* (2023.01)
*H10N 50/80* (2023.01)
*H10N 50/85* (2023.01)

(52) U.S. Cl.
CPC ............ *H10B 61/22* (2023.02); *H10N 50/10* (2023.02); *H10N 50/80* (2023.02); *H10N 50/85* (2023.02)

(58) Field of Classification Search
CPC ........ H10B 61/22; H10N 50/80; H10N 50/85; H10N 50/10
See application file for complete search history.

(56) References Cited

U.S. PATENT DOCUMENTS 6,925,000 B2    8/2005    Sussner
7,508,041 B2    3/2009    Noh
7,859,892 B2    12/2010   Clinton
(Continued)

FOREIGN PATENT DOCUMENTS

CN    106783862 A    5/2017
CN    114649471 A    6/2022
(Continued)

OTHER PUBLICATIONS

Prejbeanu et al., "Novel approach for nano-patterning magnetic tunnel junctions stacks: A route towards high density STT-RAM application", 2018 IEEE International Magnetics Conference (INTERMAG), Conference Paper, 1 Page.
(Continued)

*Primary Examiner* — Jay C Kim
*Assistant Examiner* — Woo K Lee
(74) *Attorney, Agent, or Firm* — Jordan T. Schiller (57) ABSTRACT

An approach to provide a funnel-shaped spin-transfer torque (STT) magnetoresistive random-access memory (MRAM) device with a dual magnetic tunnel junction. The approach includes providing a metal pillar on a connection to a semiconductor device. The approach includes providing a first reference layer on the metal pillar and on a portion of a first interlayer dielectric adjacent to the metal pillar. The approach includes providing a first tunnel barrier on the first reference layer and a free layer on the first tunnel barrier layer. The approach includes providing a second tunnel barrier on the free layer and a second reference layer on the second tunnel barrier of the semiconductor structure of the funnel-shaped spin-transfer torque MRAM device.

7 Claims, 7 Drawing Sheets

(56) References Cited

U.S. PATENT DOCUMENTS

| | | | |
|---|---|---|---|
| 8,063,393 B2 | 11/2011 | Chen | |
| 8,120,003 B2 | 2/2012 | Wunnicke | |
| 9,601,544 B2 | 3/2017 | Min | |
| 10,541,268 B2 | 1/2020 | Gajek | |
| 10,692,927 B1* | 6/2020 | Gottwald | H10B 61/10 |
| 2010/0214835 A1* | 8/2010 | Ding | G11C 11/161 |
| | | | 365/173 |
| 2014/0175577 A1* | 6/2014 | Apalkov | H10N 50/10 |
| | | | 257/421 |
| 2015/0021675 A1 | 1/2015 | Min | |
| 2019/0207094 A1 | 7/2019 | Gajek | |

FOREIGN PATENT DOCUMENTS

| | | |
|---|---|---|
| DE | 112018001903 T5 | 1/2020 |
| DE | 1020211306361 A | 6/2022 |
| GB | 2603275 B | 2/2023 |
| JP | 2022098498 A | 7/2022 |

OTHER PUBLICATIONS

GB Combined Search and Examination Report for GB Application No. GB2117432.1, Filing Date: Dec. 2, 2021, dated May 6, 2022, 9 pages.

Ikeda et al., "Tunnel magnetoresistance of 604% at 300K by suppression of Ta diffusion in CoFeB/MgO/CoFeB pseudo-spin-valves annealed at high temperature", Applied Physics Letters, vol. 93, Issue 8, Aug. 29, 2008, pp. 082508-082508-3.

Response to Examination Report of May 6, 2022, dated Aug. 10, 2022, GB Application No. 2117432.1, 14 pages.

Zhang et al., "Scaling Analysis and Application: Phase Diagram of Magnetic Nanorings and Elliptical Nanoparticles", arXiv:0709.4061v2, Department of Physics and Astronomy, University of Southern California, Aug. 30, 2008, pp. 1-8.

German Examination Notice for Application No. DE102021130636.1, Filing Date: Nov. 23, 2021, dated Sep. 15, 2023, 7 pages.

* cited by examiner

THREE-DIMENSIONAL FUNNEL-LIKE SPIN TRANSFER TORQUE MRAM CELL WITH A NON-UNIFORM THICKNESSES IN EACH LAYER

BACKGROUND OF THE INVENTION

The present invention relates generally to the field of semiconductor memory device technology and more particularly to magnetoresistive random-access memory devices.

Magnetoresistive Random Access Memory (MRAM), based on the integration of silicon based complementary silicon-oxide semiconductor (CMOS) with magnetic tunnel junction (MTJ) technology, is now a promising non-volatile memory technology with many advantages in terms of writing/read speed, power consumption, and lifetime over other commercialized memory types including SRAM, DRAM, Flash, etc. Conventional MRAM devices include a magnetic tunnel junction (MTJ) structure having magnetic layers separated by an intermediary non-magnetic tunnel barrier layer. Digital information can be stored in the memory element and can be represented by directions of magnetization vectors. In response to current applied to the MTJ, the magnetic memory element exhibits different resistance values and allows an MRAM device to provide information stored in the magnetic memory element. Typically, MRAM devices may be fabricated with a field effect transistor (FET) which can access the MRAM device.

A more recent development in MRAM technology utilizes spin-transfer torque (STT) in the formation of MRAM devices. STT MRAM devices are formed with a perpendicular MTJ that manipulates the spin of electrons with a polarizing current to change the magnetic state of the free layer of the MTJ in order to write the bits in the memory array. STT MRAM devices utilize spin-transfer switching so that spin-aligned or polarized electrons in one layer produce a torque when flowing onto a second layer and switch the spin in the second layer.

SUMMARY

Embodiments of the present invention provide a structure of funnel-shaped spin transfer torque (STT) magnetoresistive random-access memory (MRAM) device with a single or dual magnetic tunnel junction. The semiconductor structure includes a metal pillar on a connection to a semiconductor device. The semiconductor structure includes a first reference layer on the metal pillar walls and on a portion of a first interlayer dielectric adjacent to the metal pillar. The semiconductor structure includes a first tunnel barrier on the first reference layer and a free layer on the first tunnel barrier layer. Additionally, the semiconductor structure includes a second tunnel barrier on the free layer and a second reference layer on the second tunnel barrier.

Embodiments of the present invention provide a method of forming a magnetoresistive random-access memory (MRAM) device. The method includes depositing a free layer on an interlayer dielectric layer and on a metal pillar. The metal pillar has angled sides and is over a contact to a semiconductor device. The method includes depositing a tunnel barrier layer over the free layer. The method includes depositing a reference layer over the tunnel barrier layer. Furthermore, the method includes removing a horizontal portion of the free layer, the tunnel barrier layer, the reference layer, and a top portion of the interlayer dielectric adjacent to the metal pillar and forming a contact over a remaining portion of the reference layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that conventional structures and methods of forming a spin transfer torque (SST) Magnetoresistive Random Access Memory (MRAM) devices with perpendicular magnetic anisotropy (PMA) presents a number of technical challenges. Embodiments of the present invention recognize that conventional STT MRAM with PMA have low switching efficiency due to the difficulty in simultaneously achieving both high PMA and low damping. High PMA materials usually contain heavy metal oxides which due to the heavy metal oxides strong spin-orbital coupling have high damping while low damping materials do not provide strong enough PMA to work with a barrier layer such as a layer of MgO. A second method of achieving high PMA by increasing number of MgO/ferromagnet interfaces also do not work, because spin transfer torque delivered by reference layer acts only on first ferromagnetic layer and is not enough large to switch the whole composite free layer having additional MgO/ferromagnet interfaces.

Embodiments of the present invention recognize that conventional STT MRAM with PMA exhibit decreasing PMA in both the free layer and the reference layer of the MTJ when the STT MRAM device size decreases. At very small STT MRAM device sizes both the free layer and the reference layers are unstable. Reference layer instabilities can cause write errors on deep WER floor levels. Unstable free layers can cause retention errors. Embodiments of the present invention recognize that in conventional STT MRAM with PMA these instabilities are stronger in smaller STT MRAMs and therefore, scaling STT MRAMs with very small complimentary metal-oxide semiconductors (CMOS) based devices or transistors will be challenging and/or limited.

Embodiments of the present invention recognize that conventional STT MRAM with PMA also can require reference layers to have very complex structures. Embodiments of the present invention recognize that conventional STT MRAM with PMA commonly utilize synthetic anti-ferromagnets (SAF) with multiple magnetic material layers to minimize local magnetic fields coming from reference layer and acting on the free layer. Depositing multiple layers of materials to form the reference layer with as a synthetic anti-ferromagnetic layer complicates manufacturing processes, increasing cost and reducing yields. Additionally, in order to ensure good PMA and stability, the reference layer becomes very thick.

Embodiments of the present invention recognize that conventional STT MRAM with PMA have difficulty achieving both a high magnetoresistance ratio (MR) and fast STT switching. High MR materials that provide a good ability to read data usually have high magnetic moments limiting STT switching speeds. As a result, embodiments of the present invention recognize that conventional STT MRAM with PMA will have difficulties in providing fast switching devices that also provide effective read capability when low MR materials are used to increase switching speeds. Ideally, materials with high magnetic saturation and a low thickness (e.g., in the range of 5 to 20 angstroms) can provide faster switching speeds with good read capability.

Embodiments of the present invention recognize that conventional STT MRAM with PMA for a given size CMOS transistor current is closely related to the MTJ area of the MRAM device or more specifically, to the resistance in ohms per area in square microns of the MTJ. Embodiments of the present invention recognize that conventional STT MRAM with PMA is limited by size of the CMOS transistor and related current as smaller MTJ need to have thinner tunnel barrier layers to match smaller currents of the CMOS transistors. Embodiments of the present invention recognize that tunnel barrier optimization and or thickness is limited due to a size of the CMOS select transistor.

Embodiments of the present invention recognize that conventional STT MRAM with PMA generally are limited forming memory cells with a free layer above the reference layer. Embodiments of the present invention recognize that forming a stable reference layer above a tunnel barrier layer composed of MgO is challenging especially when the reference layer is a SAF with multiple magnetic material layers. For this reason, the free layer is generally above the reference layer in most conventional STT MRAMs with PMA. However, embodiments of the present invention recognize that having the reference layer above the tunnel barrier layer provides a better electrical match with n-type CMOS transistors and provides a smoother tunnel barrier layer with better device magnetics and better switching efficiency.

Embodiments of the present invention recognize that conventional STT MRAM with PMA a most efficient MRAM design can be a dual MTJ (DMTJ) design which includes two reference layers and two tunnel barrier layers with a free layer where a first reference layer and a first tunnel barrier layer have the free layer above them and below a second reference layer and the tunnel barrier. In conventional STT MRAM with PMA, the formation of numerous magnetic layers in the various reference layers requiring SAF become extremely difficult to make.

Embodiments of the present invention provide a new MRAM geometry for STT MRAM devices and a method of forming the new STT MRAM devices using a funnel-like semiconductor structure. Embodiments of the present invention use a deposition process that is highly uniform. Using a physical vapor deposition or ion beam deposition with highly parallel beams across the semiconductor substrate surface above the wafer surface where the semiconductor substrate surface is a three-dimensional surface including metal pillar structures results in non-uniform thicknesses within each layer due to the three-dimensional nature of the semiconductor substrate surface. The method of forming the funnel-like STT MRAM devices creates a variable thickness within of each layer of a magnetic tunnel junction (MTJ) structure. The funnel-like STT MRAM with an MTJ that has ferromagnetic layers separated by an intermediary non-magnetic tunnel barrier layer. The funnel-like STT MRAM devices include an MTJ where the material thicknesses in each of the MTJ layers on sides of the funnel above the metal pillar and the material thicknesses of each layer of the MTJ that are on the surfaces parallel to a semiconductor substrate or wafer surface are different. Embodiments of the present invention using the new funnel-like STT MRAM devices can be different thickness of each layer of the MTJ and additionally provide different thickness within each layer of the MTJ.

Embodiments of the present invention using the new funnel-like SST MRAM structure and the method of forming the funnel-like MRAM structure provides a funnel-like STT MRAM device capable of providing efficient, high switching speed while overcoming or improving each of the challenges associated with conventional STT MRAM technology discussed above. The non-uniform thickness within in each layer of the MTJ layers occurs by using an oblique angle of deposition for the layers of the MTJ. For various layers of the MTJ stack, the oblique angle of deposition varies depending on the layer of the MTJ stack being deposited. Embodiments of the present invention provide a funnel-like STT MRAM device that can be formed directly on a connection or contact to a CMOS device or transistor.

Embodiments of the present invention using the new funnel-like STT MRAM devices using a specific ratio of funnel tube radius to funnel tube height and a proper thickness of each of the magnetic layers in the MTJ can have a vortex state in the funnel-like STT MRAM device structure. A vortex state is a closed magnetic flux structure where local magnetization vectors curl in the plane of the funnel-like tube and are parallel to the top and bottom sides of the funnel-like tube. The vortex state of the funnel-like STT MRAM structure is energetically stable and furthermore, provides proper retention over a broad range of temperatures. With the use of a closed flux vortex state in the funnel-like STT MRAM devices, using a short nano-funnel in the funnel like STT MRAM device allows the spin transfer torque to overcome only the exchange forces to form a dynamic domain wall that can reverse the bit. In this case, good bit retention will be preserved in very small or ultra-small funnel-like STT MRAM devices in the range of one to five nanometers that are limited only by superparamagnetism or spin quantum tunneling.

Due to the presence of a vortex state in funnel-like STT MRAM devices, embodiments of the present invention do not need PMA materials with heavy metals or multipole MgO/ferromagnet interfaces. Embodiments of the present invention form the new funnel-like STT MRAM devices using low damping magnetic materials such as $Co_{25}Fe_{75}$ or $Fe_{50}Ni_{50}$. The use of low damping magnetic materials in the funnel-like STT MRAM devices allows high switching efficiency and speed. Furthermore, a closed flux structure forming a vortex state provides good magnetic retention in funnel-like STT MRAM device structures at small and very small memory cell. In this way, embodiments of the present invention provide a funnel-like STT MRAM device with low magnetic moment materials laminated with CoFeB (CBF) materials of various compositions as free layers to get fast switching and a good MR signal without requiring PMA or PMA materials. Embodiments of the present invention allows to use a funnel-like STT MRAM device with a good exchange or high magnetization while preserving low local magnetic fields at the edges of the funnel-like tube.

Embodiments of the present invention provide a funnel-like STT MRAM device with the vortex states in both the free layer and the reference layer. The free layer tube is relatively short and possess an exchange length that is larger than the funnel-like STT MRAM device dimensions. Specifically, from modelling, a funnel-like STT MRAM device with an aspect ratio of funnel tube height over funnel tube radius is approximately less than 1.81 then, the nano funnel local magnetization curls around in the funnel. In the case, the funnel-like STT MRAM device with a vortex state has a closed magnetic flux. The vortex state for both the free layer and the reference layer minimizes magnetostatic coupling between the free layer and the reference layer and thereby, simplifies STT dynamical reversal of the free layer. Additionally, short nano funnels with thin free layers energetically favors the generation and propagation of Neel wall along the funnel tube perimeter during STT switching. When local magnetic directions are curled along the nano tube walls, the STT switching can be fast and efficient and additionally, bit retention will be good as spontaneous reversal of the whole vortex structure by thermal fluctuations is very unlikely or difficult.

Embodiments of the present invention provide a funnel-like STT MRAM device provide an ability to build both funnel-like STT MRAM devices with free layer on top of the reference layer and an ability to build inverted STT MRAM devices with reference layers on above or top of the free layer. Embodiments of the present invention provide a funnel-like STT MRAM device with a dual MTJ (DMTJ) device structure with both reference layers that are stable, and a free layer possess the highest possible retention for a given amount of magnetic volume. Additionally, embodiments of the present invention provide a method of forming STT MRAM devices with non-SAF reference layers can be both thinner and easier to manufacture and as such are advantageous over various conventional STT MRAM designs.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for MRAM devices, and only so much of the commonly practiced process steps are included as are necessary for an understanding of the described embodiments. The figures represent cross-section portions of a MRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention. For the purposes of the present invention, the terms funnel-shaped STT MRAM device and funnel-shaped STT MRAM device are considered the same or interchangeable.

Figure 1:
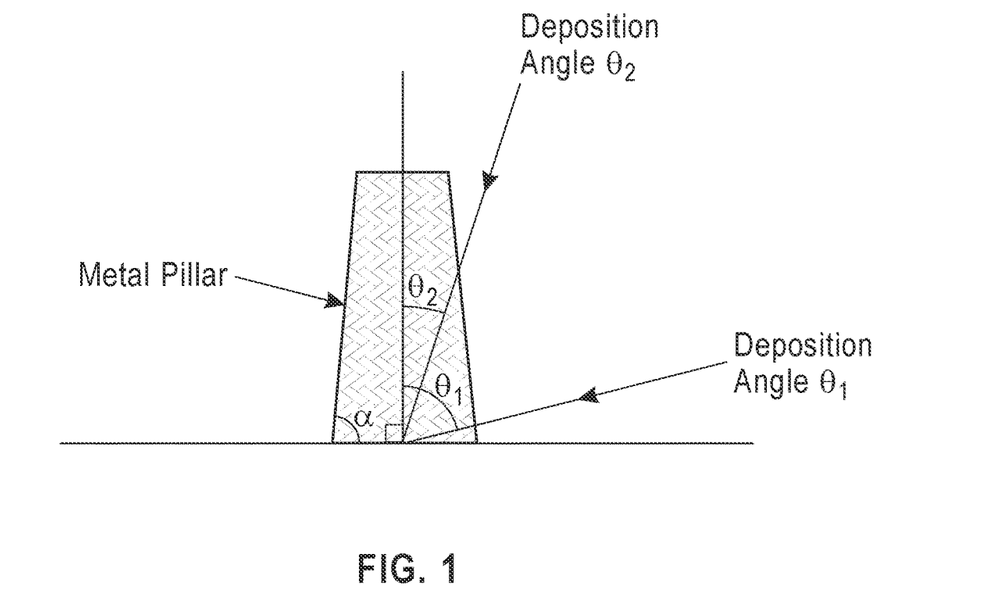
FIG. 1 is a cross-sectional view of a pillar used to form a funnel-shaped spin-transfer torque MRAM device in accordance with an embodiment of the present invention.

FIG. 1 is a cross-sectional view of a metal pillar used to form a funnel-like or funnel-shaped STT MRAM device in accordance with an embodiment of the present invention. As depicted FIG. 1 includes the metal pillar on a surface such as a surface of a portion of a semiconductor structure above a semiconductor wafer or on a portion of a semiconductor wafer (not depicted in FIG. 1) where the angle of an outside wall of the metal pillar with respect to the horizontal surface is angle α and deposition angles θ1 and θ2 illustrate oblique deposition angles with respect to a reference direction perpendicular or normal to the horizontal surface as depicted in FIG. 1. In various embodiments, angle α ranges from 90 degrees to 45 degrees from the horizontal surface of a semiconductor substrate or wafer (not depicted) for forming the metal pillar. The metal pillar has a flat top funnel-like shape or flattened cone shape. The deposition angles θ1 and θ2 are oblique angles of deposition. Deposition angles θ1 and θ2 measured with respect to a direction perpendicular to the semiconductor substrate or wafer surface (or normal to wafer surface). In various embodiments, deposition angle θ1 is used in deposition of the free layers and one or more reference layers on the metal pillar while deposition angle θ2 is used in the deposition of tunnel barrier materials. The semiconductor wafer (not depicted) is rotated during the deposition of the various layers of the funnel-like STT MRAM devices discussed with reference to FIGS. 1-9.

Figure 2:
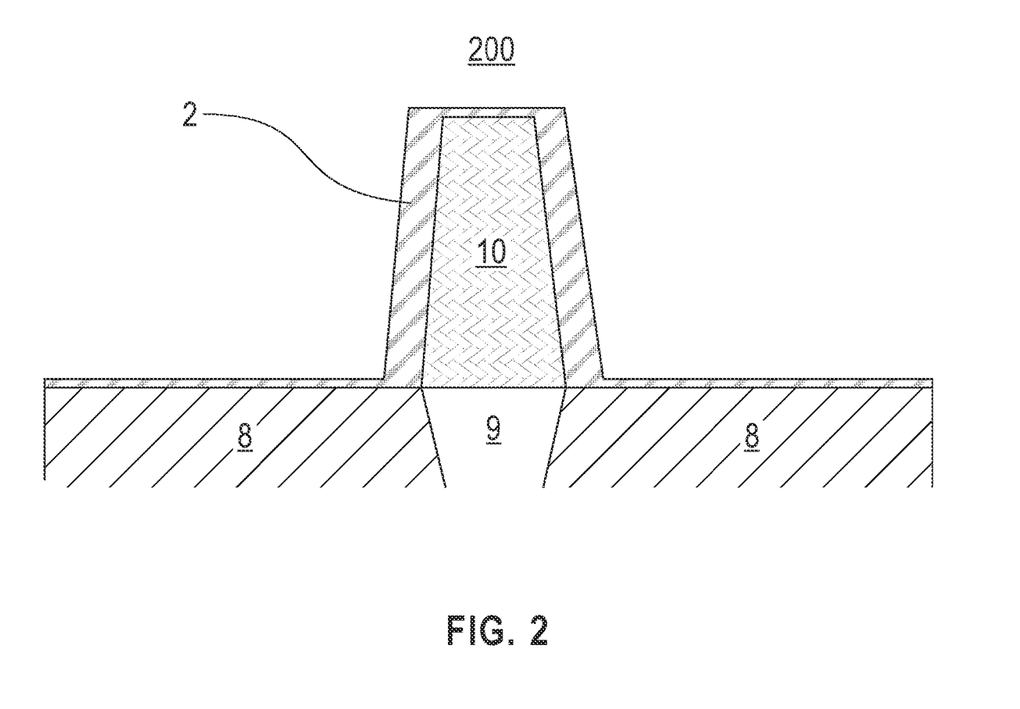
FIG. 2 is a cross-sectional view of the semiconductor structure after forming a free layer over the pillar in accordance with an embodiment of the present invention.

FIG. 2 is a cross-sectional view of semiconductor structure 200 after forming free layer 2 over metal pillar 10 in accordance with an embodiment of the present invention. As depicted, FIG. 2 includes interlayer dielectric (ILD 8), contact 9, metal pillar 10, and free layer 2 deposited on metal pillar 10. In various embodiments, ILD 8 is above a semiconductor device (not depicted) in a semiconductor substrate or semiconductor wafer (not depicted). ILD 8 can be any dielectric material deposited over a semiconductor device for electrical isolation such as $SiO_2$. ILD 8 has a top horizontal surface above the semiconductor wafer (not depicted). In various embodiments, contact 9 is a via or a metallic connection to an underlying semiconductor device such as a CMOS transistor. In some embodiments, contact 9 is in direct contact with a source/drain or with a source/drain contact of the semiconductor device.

In various embodiments, metal pillar 10 is formed with an angle α to the top surface of ILD 8 directly over contact 9. Angle α, as previously described, ranges from 90 degrees to 45 degrees. For example, typical angle α for the funnel-like STT MRAM structures depicted in FIGS. 2-9, angle α can be in the range of 80 degrees for typical thicknesses discussed for each layer unless otherwise specified. As depicted in FIG. 2, metal pillar 10 have a flat top forming a funnel-like shape for metal pillar 10, but the top of metal pillar can be also rounded. In various embodiments, a typical height of metal pillar 10 ranges from 4 nm to 40 nm but, is not limited to these heights.

In various embodiments, free layer 2 is a layer of a magnetic material deposited with deposition angle θ1 while the semiconductor substrate or wafer (not depicted) containing semiconductor structure 200 rotates or spins around an axis perpendicular to the semiconductor wafer surface. As previously discussed with respect to FIG. 1, the oblique deposition angle (i.e., deposition angle θ1), can be typically be in a range of 70 to 80 degrees with reference to or measured to a direction perpendicular to a semiconductor wafer surface however, deposition angle θ1 is not limited to these angles. In various embodiments, the rotation of the semiconductor substrate or wafer ensures a uniform deposition of materials along the sides of metal pillar 10. In various embodiments, a stream of atoms deposits over metal pillar 10 and top surface of ILD 8, for example, using physical vapor deposition (PVD) or ion beam deposition (IBD).

An oblique deposition of free layer 2, using deposition angle θ1, results in two different thicknesses of the deposited layer of free layer 2 on sides of metal pillar 10 when compared to the thickness of the deposited layer of free layer 2 on horizontal surfaces of semiconductor structure 200. In various embodiments, free layer 2 is thicker on the sides of metal pillar 10 and is much thinner on the top of metal pillar 10 and on ILD 8. For example, with deposition angle $θ_1$ in the range of 70 to 80 degrees, a thickness of free layer 2 on the sides of metal pillar 10 is approximately 15 to 25 angstroms while a thickness of free layer 2 on the top surface of ILD 8 and on top of metal pillar 10 is in the range of 3 to 5 angstroms. With deposition angle θi of 80 degrees, a thickness of free layer 2 on the sides of metal pillar 10 is approximately five times greater than the thickness of free layer 2 on horizontal surfaces (e.g., on the top of metal pillar 10 and on exposed horizontal surfaces of ILD 8 above the semiconductor wafer surface (not depicted). In other examples using different deposition parameters or different angle α of metal pillar 10, a thickness of free layer 2 can range from 10 to 50 angstroms on the sides of metal pillar 10. As a result of the angled deposition of free layer 2, free layer 2 parts located on ILD 8 surface and on the top of the pillar 10 are essentially non-conductive due to the extremely thin layer of material deposited on the horizontal surfaces. As a result, a little or negligible electrical current flow in the horizontal portions of free layer 2. Additionally, the very thin horizontal portions of free layer 2 has essentially little to no magnetization and, as such, act like a nonferromagnetic layer. Therefore, the thin horizontal portions of free layer 2 do not disturb the magnetic properties of the thicker portions of free layer 2 located on the angled side walls of pillar 10.

Free layer 2 can be composed of various magnetic materials with differing compositions and thicknesses. For example, free layer 2 may be one or more compositions of cobalt, iron, and born (CFB) with a range of thickness of 10 to 50 angstroms. In another example, free layer 2 may be bilayers of CFB for high MR and $Co_{25}Fe_{75}$ for low damping to provide fast switching of the funnel-like STT MRAM device. In other examples, free layer 2 can be CoX or FeX, where X is a light metal such as Li, Be, Mg, Al or any transition metal. In another example, bilayers of ultra-thin CFB for high MR and Heusler alloys, such as CoFeAl or NiMnSb, can be used as low damping materials. In yet another example, free layer 2 can be bilayers of CFB and soft magnetic materials like permalloy (i.e., a nickel-iron magnetic alloy) to avoid domain wall formation. Free layer 2 is not limited to these materials.

Figure 3:
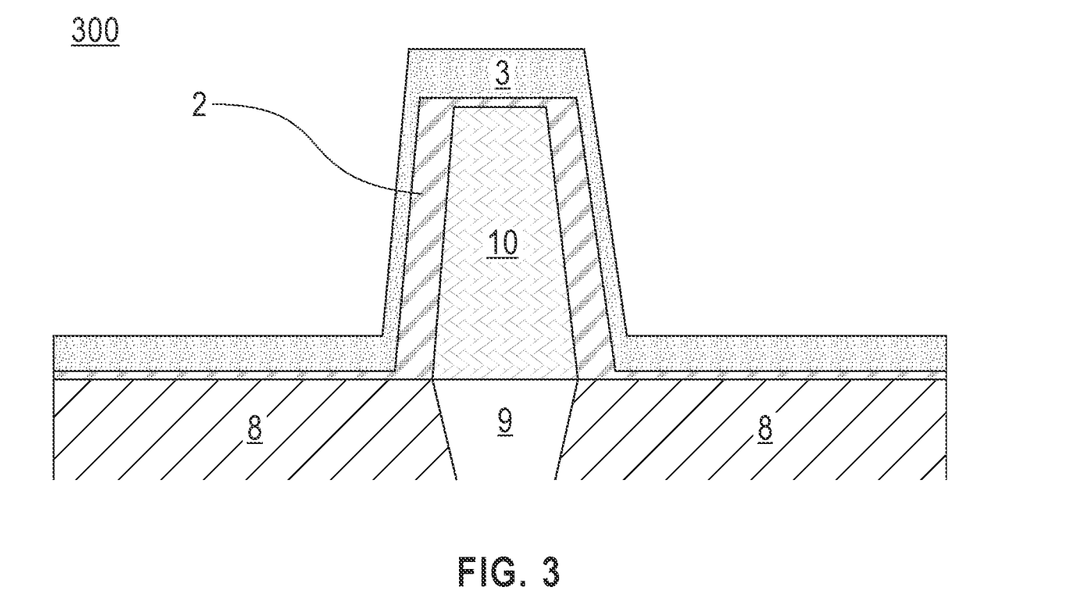
FIG. 3 is a cross-sectional view of the semiconductor structure after forming a barrier layer over the free layer in accordance with an embodiment of the present invention.

FIG. 3 is a cross-sectional view of semiconductor structure 300 after forming tunnel barrier 3 over free layer 2 in accordance with an embodiment of the present invention. As depicted, FIG. 3 includes ILD 8, contact 9, metal pillar 10, free layer 2, and tunnel barrier 3. As with free layer 2 deposition and all following MTJ material layer depositions, the semiconductor substrate or wafer is rotating during deposition. In various embodiments, deposition angle θ2 is used to deposit tunnel barrier 3. For example, an oblique deposition angle θ2 can be in the range of 10 to 15 degrees resulting in a low thickness of tunnel barrier 3 (about 10 angstroms) on metal pillar 10 sides and approximately 16 to 40 angstroms on the top of metal pillar 10 and on the top of ILD 8 (assuming angle α of 80 degrees). In other examples using different deposition parameters, a thickness of tunnel barrier 3 can range from 8 angstroms to 20 angstroms (depend on various material used as tunnel barrier) on the angled sides of free layer 2 above sides of metal pillar 10. The non-uniform material thickness deposition of tunnel barrier 3 results in a very thick layer of tunnel barrier 3 on the horizontal surface of free layer 2 that is above ILD 8 and a thick deposition of tunnel barrier 3 on free layer 2 that is above the top or horizontal portion of metal pillar 10. These thick portions of tunnel barrier 3 can be considered essentially non-conductive. Electrical current cannot flow through these thick horizontal sections of tunnel barrier 3 or will be negligible or near zero. A thinner layer of tunnel barrier 3, approximately 8-20 angstroms thick, can be present on free layer 2 over the sides of metal pillar 10 what allows electron to tunnel thought these regions. The portion of tunnel barrier 3 on the side wall of metal pillar 10 is thin enough to allow electron tunneling and the horizontal portions of tunnel barrier 3 are thick enough to prevent electron tunneling.

In various embodiments, tunnel barrier 3 is composed of MgO. In some embodiments, tunnel barrier 3 is composed of $TiO_2$, $CsO_x$, $BaO_x$, $SrO_x$, $ZrO_2$, $HfO_2$, $Al_2O_3$, MgAlO, or any combination or compound of these materials capable of providing good tunnel barriers but, tunnel barrier 3 is not limited to these materials, where x can be any number of oxygen atoms forming a compound material for a good tunnel barrier.

Figure 4:
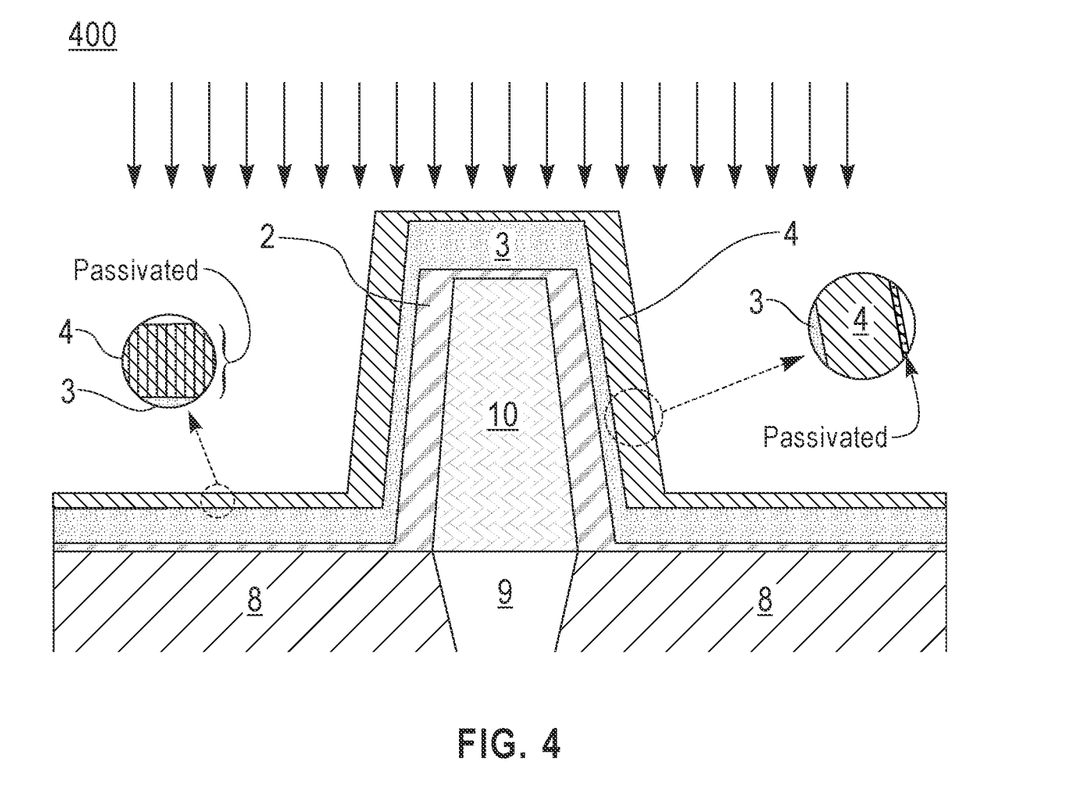
FIG. 4 is a cross-sectional view of the semiconductor structure after depositing a reference layer over the barrier layer and passivating the reference layer in accordance with an embodiment of the present invention.

FIG. 4 is a cross-sectional view of semiconductor structure 400 after depositing reference layer 4 over tunnel barrier 3 and passivating reference layer 4 in accordance with an embodiment of the present invention. Using deposition angle $\theta_1$, reference layer 4 is deposited on tunnel barrier 3. For example when deposition angle $\theta_1$ of 80 degrees is used, a thickness of the deposited layer on tunnel barrier 3 above the sides of metal pillar 10 in the range of 25 to 35 angstroms while a deposition of reference layer 4 on the horizontal surfaces of tunnel barrier 3 (e.g., above ILD 8 and above the top of the metal pillar 10) is in the range of 3 to 6 angstroms. In other examples, a range of thickness of reference layer 4 over tunnel barrier 3 above the angled sides of metal pillar 10 can be 20 to 100 angstroms thick when different deposition angles are used. As a result of the different thicknesses of reference layer 4 on angled sides of metal pillar and horizontal surfaces of semiconductor structure 400, reference layer 4 on tunnel barrier 3 above ILD 8 is essentially non-conductive due to the extremely thin layer of reference layer 4 on the horizontal surface (e.g., little to no electrical current to pass).

In various embodiments, reference layer 4 is composed of CFB. In some embodiments, reference layer 4 is composed of one or more bilayers of CFB and high damping materials (e.g., heavy metals) to improve reference layer 4 stability under STT switching. In other embodiments, reference layer 4 is composed of bilayers of CFB and one or more antiferromagnetic layers to pin CFB. In one embodiment, reference layer 4 is composed of bilayers of CFB and SAF layers to minimize stray dynamic fields coming from reference layer 4 that can act on free layer 2 during STT switching.

In the MTJ stack of funnel-like STT MRAM device, reference layer 4 can be two or more times thicker than free layer 2 to ensure stability during STT switching. In another embodiment of the MTJ stack, the reference layer 4 is laminated with a antiferromagnetic (AFM) layer for good STT switching. In yet another embodiment of the MTJ stack, the reference layer 4 is laminated with a high damping layer such as Ta, W, Jr and Pt.

In an alternative embodiment, reference layer 4 is deposited directly on metal pillar 10. In this embodiment, tunnel barrier 3 can be deposited directly on reference layer 4 and free layer 2 can be deposited on tunnel barrier 3 using the deposition angles previously discussed (e.g., deposition angle $\theta_1$ for reference layer 4 and free layer 2 and deposition angle $\theta 2$ for tunnel barrier 3). When the deposition of each of the layers of the MTJ stack (e.g., reference layer 4, tunnel barrier 3, and free layer 2) is complete, a MTJ stack forms an inverted funnel-like STT MRAM device. The MTJ stack for forming an inverse STT MRAM device can have free layer 2 over tunnel barrier 3 and tunnel barrier 3 over reference layer 4 and reference layer 4 is deposited directly on metal pillar 10.

In various embodiments, a passivation of reference layer 4 occurs using highly parallel oxygen ion beams when reference layer 4 is thicker than 5 angstroms in the horizontal plane above ILD 8 and when forming a DMTJ for the funnel-like STT MRAM device discussed later with respect to FIGS. 8-9. When the thickness of reference layer 4 is greater than 5 angstroms in the horizontal portions above ILD 8, then the highly parallel oxygen ion beams can be directed at the top surface of semiconductor structure 400. The oxygen beams are perpendicular to the horizontal wafer surface as depicted in FIG. 4. The thickness of the passivation layer of reference layer 4 varies according to the location of reference layer 4. The passivation or oxidation of reference layer reduces the electrical conductance of reference layer 4. The passivated portions of reference layer 4 become electrically resistive.

In horizontal portions of reference layer 4, the passivation can be completely through the thickness of reference layer 4. For example, as depicted in the left breakout section of the horizontal portion of reference layer 4 above ILD 8 is completely passivated and will have a very high electrical resistance. The complete passivation of the horizontal portions of reference layer 4 limits the conductance of the horizontal portions of reference layer 4 and makes the horizontal portions behave like a non-ferromagnetic material. The energy of the oxygen ion beam can be adjusted, for example, between 50 eV to 800 eV, to achieve a desired passivation penetration depth. For example, when the horizontal portions of reference layer 4 are approximately 5 angstroms, the energy of the oxygen ion beam can be adjusted to attain a passivation thickness of 5 angstroms in the horizontal portions of reference layer 4.

In semiconductor structure 400, the thickness of the passivation of reference layer 4 above the sides of metal pillar 10 is very thin, for example, in the range of an angstrom when the thickness of reference layer 4 is about 25 to 35 angstroms above the angled sides of metal pillar 10. The penetration depth of the passivation on the angled or sloped sides of metal pillar 10 is affected by angle $\alpha$ (i.e., angle of the sides of metal pillar 10) and the energy of the oxygen ion beam. An example of the thickness of the passivation of reference layer 4 is depicted in the right breakout of reference layer 4 above the sides of metal pillar 10.

Figure 5:
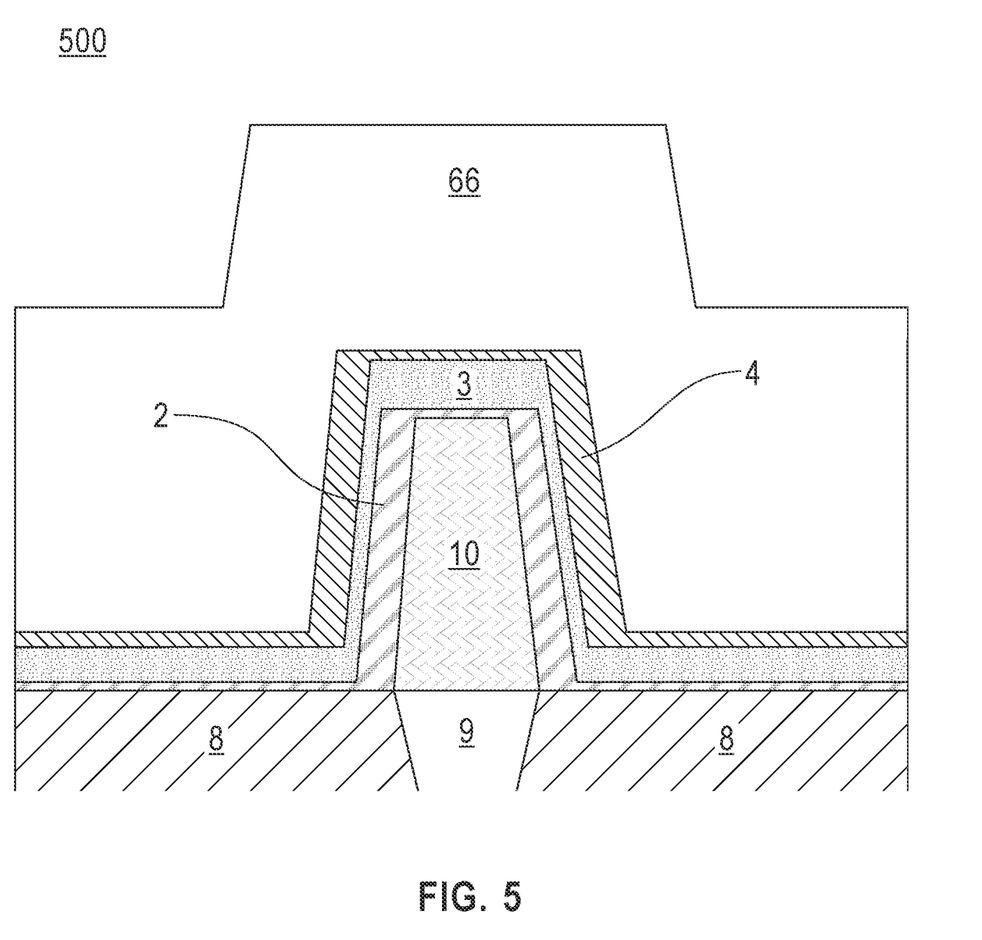
FIG. 5 is a cross-sectional view of the semiconductor structure after deposition of a top contact layer in accordance with an embodiment of the present invention.

FIG. 5 is a cross-sectional view of semiconductor structure 500 after top contact 66 deposition in accordance with an embodiment of the present invention. For example, a layer of metal for top contact 66 can be deposited over semiconductor structure 500. In some embodiments, the layer of top contact 66 material is selectively deposited. For example, the layer of top contact 66 is selectively deposited using known semiconductor processes to form top contact 66 (e.g., forms the bit line or lines). Top contact 66 can be composed of any contact metal used in MRAM or CMOS devices.

Figure 6:
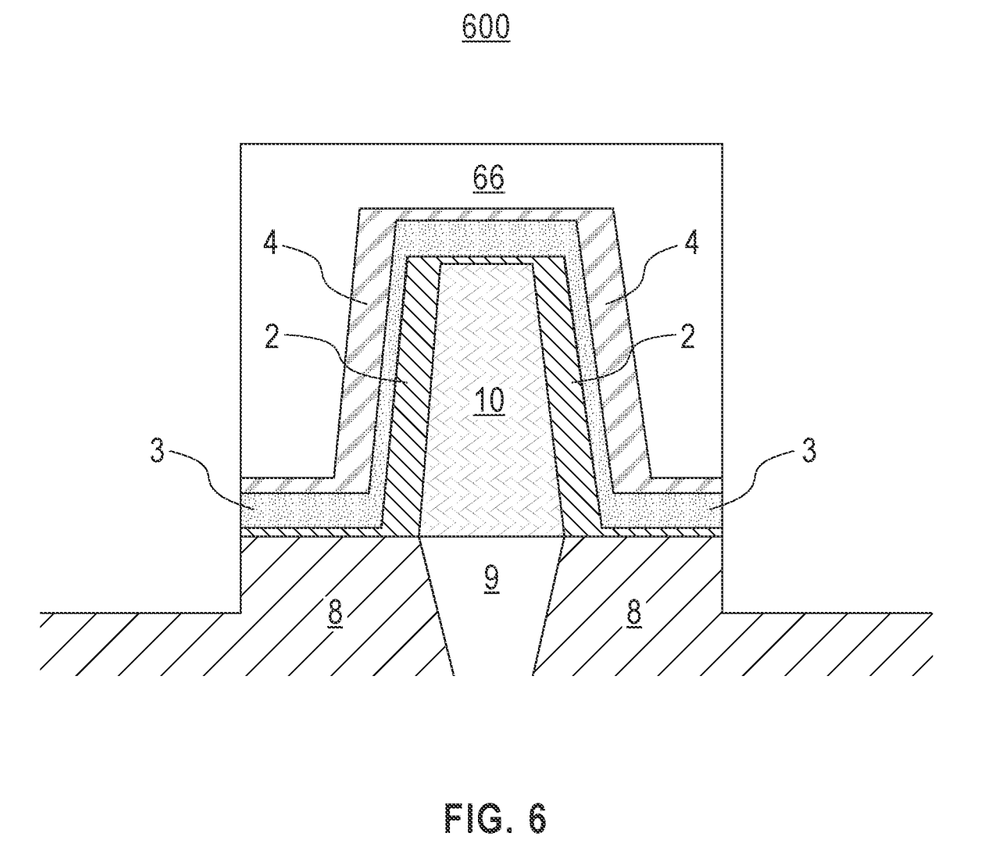
FIG. 6 is a cross-sectional view of the semiconductor structure after etching the top contact layer to a form a bit line in accordance with an embodiment of the present invention.

FIG. 6 is a cross-sectional view of semiconductor structure 600 after forming top contact 66 in accordance with an embodiment of the present invention. Top contact 66 can be selectively patterned and etched using conventional photolithography and etch processes to form top contact 66. In various embodiments, top contact 66 can be formed over reference layer 4. Top contact 66 is above the magnetic layers of the MTJ of the funnel-like STT MRAM device. Top contact 66 etch can be terminated or extended below the bottom surface of metal pillar 10. In various embodiments, the etch of top contact 66 continues into a top portion of ILD 8 adjacent to metal pillar 10. If the horizontal portions of the MTJ (e.g., reference layer 4, tunnel barrier 3, and free layer 2) are exposed, the horizontal portions of the MTJ can be passivated by exposure to oxygen plasma. In various embodiments, top contact 66 functions as a bit line.

Figure 7:
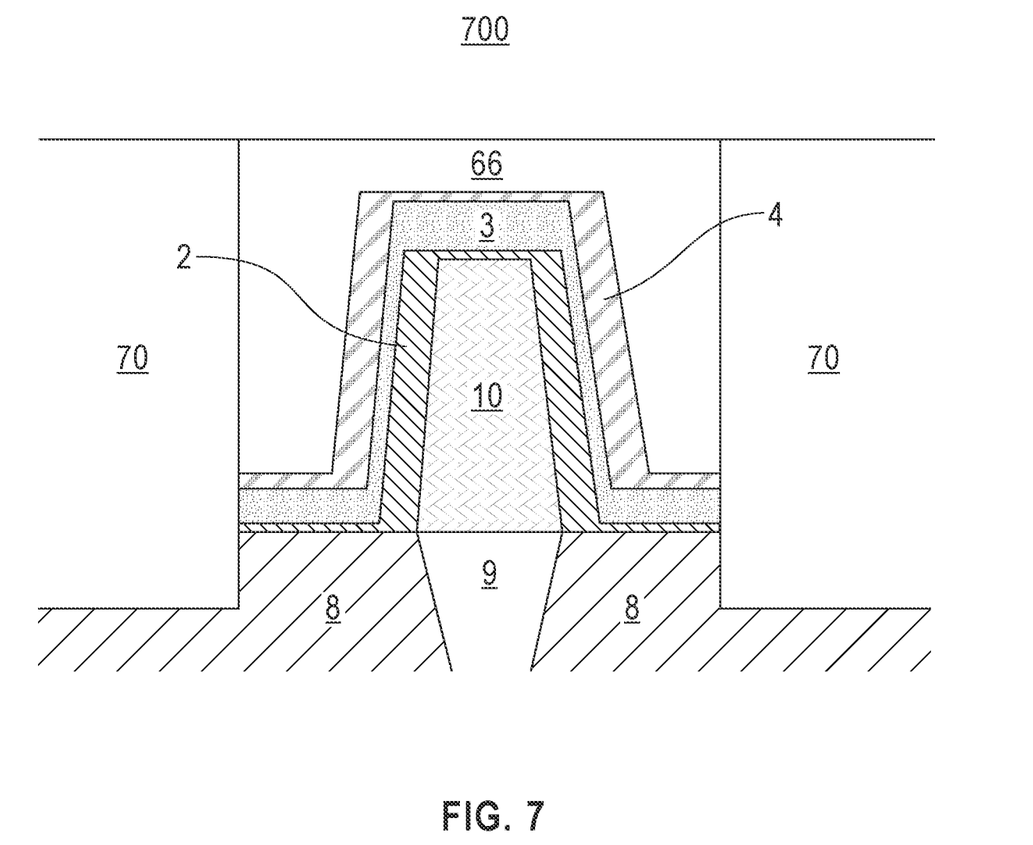
FIG. 7 is a cross-sectional view of the semiconductor structure after depositing a layer of ILD material and after performing chemical mechanical polish (CMP) in accordance with an embodiment of the present invention.

FIG. 7 is a cross-sectional view of semiconductor structure 700 after depositing a layer of ILD 70 and after performing chemical mechanical polish (CMP) in accordance with an embodiment of the present invention. In various embodiments, ILD 70 is deposited over semiconductor structure 700 and a CMP performed until contacting top contact 66 to remove a top portion of ILD 70. In some cases, the CMP may remove a top portion of top contact 66. Semiconductor structure 700 depicts one embodiment of a funnel-like STT MRAM. In various embodiments, semiconductor structure 700 depicts a funnel-like STT MRAM with a single MTJ stack composed of free layer 2, tunnel barrier 3, and reference layer 4 where free layer 2 is on metal pillar 10. In various embodiments, the MTJ stack is e covered by top contact 66. In various embodiments, a top surface of semiconductor structure 700 is exposed for further semiconductor processes such as etch processes or deposition processes to form additional connections, semiconductor devices, or interconnection layers on semiconductor structure 700. Additional metal, dielectric, or other material layers may be deposited on semiconductor structure 700 to complete formation of one or more semiconductor chips.

As previously discussed, semiconductor structure 700 forms a funnel-like STT MRAM device that provides a stable or closed vortex state in the funnel-like STT MRAM device. For the reasons previously discussed, a stable or closed vortex state in the funnel-like STT MRAM is desirable. Using the methods and structures described above in FIGS. 1-7, the funnel-like STT MRAM device can be formed with a variety of structures to match a specific transistor resistance. For example, a target resistance of 10 kohm for the funnel-like STT MRAM device to match a resistance of a specific CMOS transistor can be achieved for various device geometries. By changing tunnel barrier attributes such as resistance per area due to different tunnel barrier geometries and/or materials, a target resistance may be obtained by varying height to diameter ratio of funnel-like STT MRAM device. For example, a tunnel barrier with 20 ohms per square micron and funnel average radius of 20 nm and funnel height of 16 nm, provides a very stable vortex state as does a tunnel barrier with 5 ohms per square micron and 4 nm funnel height. This example illustrates that for broad ranges of resistance per area for tunnel barrier 3 (e.g. from 5-20 ohms per square micron), a target resistance of the funnel-like STT MRAM device can be achieved by changing the height of the funnel-like STT MRAM device (i.e., adjusting the nano-funnel height).

Figure 8:
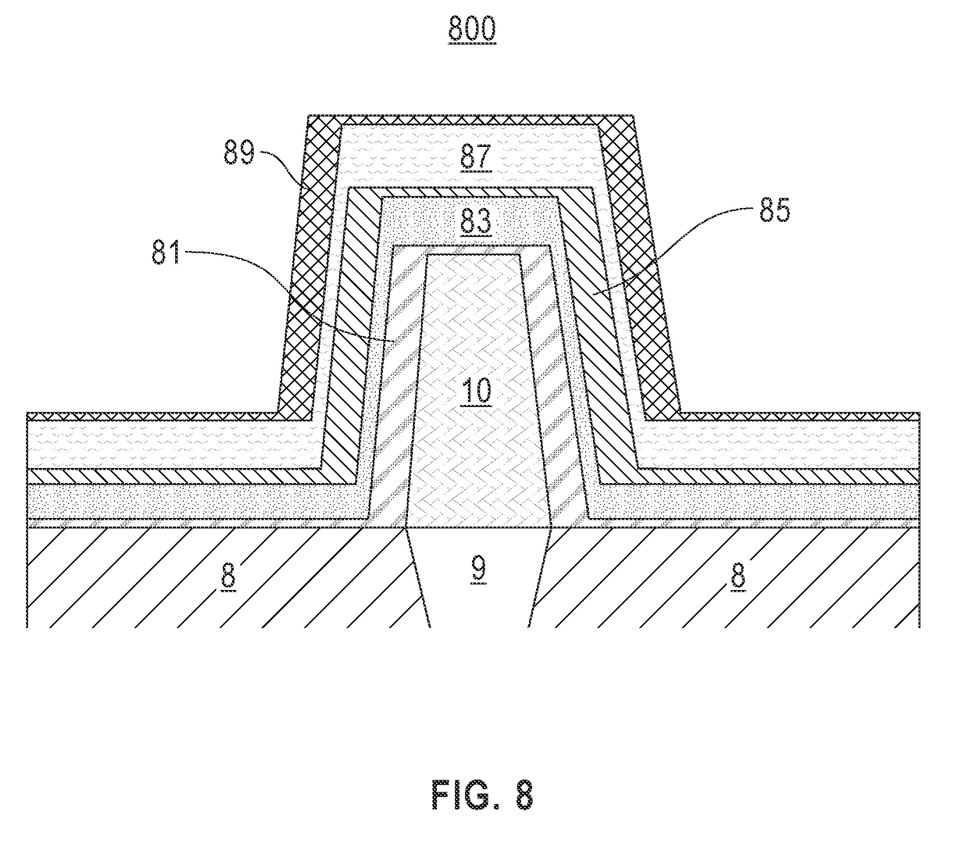
FIG. 8 is a cross-sectional view of a semiconductor structure of a second funnel-shaped STT MRAM device after deposition of all layers needed to form a DMTJ in accordance with an embodiment of the present invention.

FIG. 8 is a cross-sectional view of semiconductor structure 800 of a second funnel-shaped or funnel-like STT MRAM device with a DMTJ in accordance with an embodiment of the present invention. In various embodiments, semiconductor structure 800 is using the methods previously discussed in in FIGS. 1-7 to deposit the layers of a DMTJ on metal pillar 10.

In various embodiments, reference layer 81 is deposited over metal pillar 10. The deposition of reference layer 81 can occur using a deposition angle $\theta_1$. For example, as previously discussed, a deposition angle in the range of 80 degrees can provide a thicker deposition of reference layer 81 (i.e., a first reference layer in the DMTJ) on the angled sides of metal pillar 10. In some embodiments, the thickness of reference layer 81 deposited on the side wall of metal pillar 10 is two times or more thicker than the portion of reference layer 81 deposited on the horizontal surfaces above the semiconductor wafer surface (e.g., on the flat top of metal pillar 10 and on exposed horizontal surfaces or horizontal portions of ILD 8). The materials and material thicknesses used for reference layer 81 can be the same or similar to the materials discussed for reference layer 4 with respect to FIG. 4 but, are not limited to these materials or material thicknesses.

Tunnel barrier 83 can be deposited over reference layer 81. Tunnel barrier 83 is a first tunnel barrier layer that can be composed of MgO, although not limited to this material. Tunnel barrier 83 can be deposited with a deposition angle $\theta_2$ to provide a thicker layer on the horizontal surfaces of semiconductor structure 800 than on the angled surfaces above metal pillar 10.

Free layer 85 is deposited over tunnel barrier 83 using the deposition angle $\theta_1$ that provides a thicker layer of free layer 85 above the angled sides of metal pillar 10 and a much thinner layer of free layer 85 on the horizontal surfaces of tunnel barrier 83. In various embodiments, free layer 85 is a synthetic anti-ferromagnet (SAF) composed of three layers. Each of the three layers of free layer 85 are deposited with a deposition angle $\theta_1$. Free layer 85 can be composed of a layer of a first free layer material, for example, a material as discussed with respect to free layer 2 in FIG. 2, a middle layer of a non-magnetic spacer material to provide antiferromagnetic coupling between first and second part of free layer. Both parts of SAF free layers can be made of magnetic bilayers like $Co_xFe_yB_z/Co$ and $Co/Co_xFe_yB_z$ to make a SAF with strong anti-ferromagnetic coupling. A nonmagnetic spacer needs to provide antiferromagnetic Ruderman-Kittel-Kasuya-Yosida (RKKY) coupling between first and second parts of free layer 2. Commonly used nonmagnetic spacer materials for the middle layer of free layer 85 can be Ru and Ir. In one embodiment, a structure of free layer 85 (e.g., a structure of a SAF for free layer 85) can be $Co_xFe_yB_z/Co/Ir/Co/Co_{x1}Fe_{y1}B_{z1}$ or $Co_xFe_yB_z/Co/Ru/Co/Co_{x1}Fe_{y1}B_{z1}$, where x, y, and z identify a number of atoms and where $x_1$ $y_1$ and $z_1$ identify a different number of atoms however, free layer 85 is not limited to these materials.

In some embodiments, when the thickness of the horizontal portions of free layer 85 is greater than 5 angstroms, free layer 85 can be passivated using an oxygen ion beam process. The passivation can be done to minimize the conductance of the horizontal portions of free layer 85. The passivation process previously described in detail with respect to FIG. 4 may be used. For example, a passivation of free layer 85 can occur using highly parallel oxygen ion beams. The passivation may occur after the deposition of first layer (e.g., the first free layer of the SAF) of free layer 85 or after the deposition of the second part or non-magnetic layer of free layer 85.

Tunnel barrier 87 can be a second tunneling barrier layer. In various embodiments, tunnel barrier 87 is composed of a different material than tunnel barrier 83 and has different thicknesses than tunnel barrier 83. For example, tunnel barrier 83 can be composed of MgO and tunnel barrier 87 can be composed of $Mg_2AlO_4$ or another oxide other than MgO. A typical thickness of tunnel barrier 87 (e.g., with a 15 degree deposition angle for deposition angle $\theta_2$) could be 16 to 40 angstroms in horizontal portions of reference layer 85.

A typical thickness of tunnel barrier 87 (e.g., with angle $\theta_2=15$ degrees) on reference layer 85 above angled sides of metal pillar 10 can be 8 to 20 angstroms. By depositing different materials with different thickness than tunnel barrier 83 for tunnel barrier 87, an optimization of the MR signal from the DMTJ and spin torque generated by the DMTJ can occur simultaneously (e.g., both the MR signal and spin torque can be simultaneously maximized).

In various embodiments, reference layer 89 is deposited over tunnel barrier 87 using deposition angle θ2. The deposition of reference layer 89 using deposition angle θ2 provides a thicker layer of reference layer 89 on tunnel barrier 87 above the angled sides of metal pillar 10 and a thinner deposition of reference layer 89 on the horizontal surfaces of tunnel barrier 87. In some embodiments, the layer of reference layer 89 deposited on tunnel barrier 87 above the side walls of metal pillar 10 is two to six times thicker than the portion of reference layer 89 deposited on the horizontal surfaces of tunnel barrier 87 (e.g., above the flat top of metal pillar 10 and on tunnel barrier 87 above the semiconductor wafer surface). As previously discussed, in this manner, the thin horizontal portions of reference layer 89 are essentially non-conductive electrically or inactive magnetically. In cases when a thickness of the horizontal portions of second reference layer 89 are greater than 5 angstroms (e.g., are conductive), the passivation step described in FIG. 4 can be used to minimize the conductance in the horizontal portions of reference layer 89.

In various embodiments, reference layer 89 is composed of different materials and has a different thickness than reference layer 81. Altering materials and thickness of reference layer 89 above the sides of metal pillar 10 (i.e., on the angled sides of tunnel barrier 87) from the materials and thicknesses of reference layer 81 allows an optimization of reference layer 89's magnetic stability to occur. Additionally, changing the materials and thickness of reference layer 89 with respect to reference layer 81 provides an optimal condition for setting magnetization direction of reference layer 89 and reference layer 81. For example, when reference layer 81 is 30 angstrom thick layer of CFB on the angled surfaces of tunnel barrier 83 (i.e., above the angled sides of metal pillar 10), reference layer 89 can be 50 angstroms thick over the angled sides of tunnel barrier 87. In this case by cooling down this structure in weak external magnetic field that is perpendicular to the wafer surface, an antiparallel configuration of vortexes in both reference layers can be achieved. Reference layer 89 thickness on the angled surfaces of tunnel barrier 87 can range from 10 to 50 angstroms but, are not limited to these thicknesses. Some examples of materials for reference layer 89 include CFB, permalloy, CoFe and combinations of these materials laminated with heavy metals to increase dumping. The selection of the specific materials and material thickness of reference layer 89 can be optimized in various ways. For example, the specific materials and material thickness of reference layer 89 can be selected to achieve one or more of a maximal MR signal, a maximal device switching efficiency, to provide ensure good bit stability at elevated temperatures (e.g., in automotive applications) or to ensure good stability of reference layers.

Figure 9:
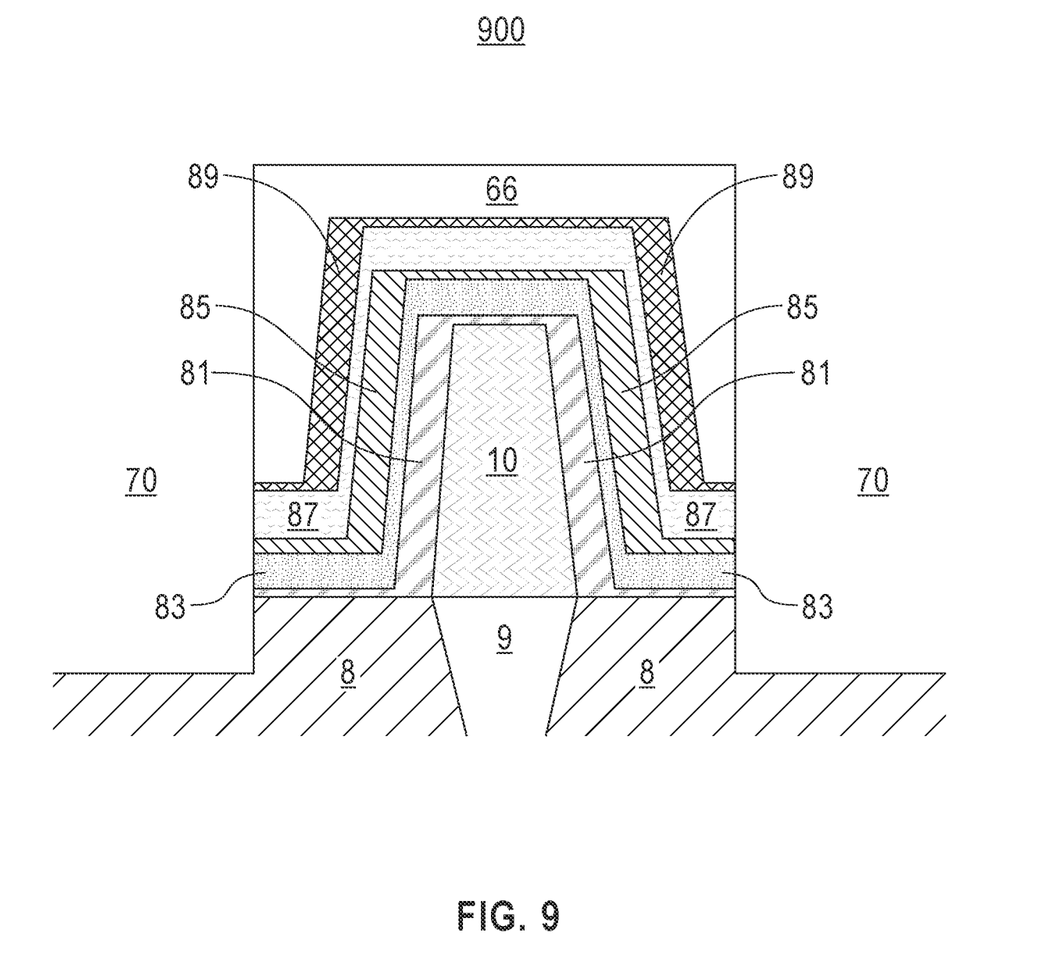
FIG. 9 is a cross-sectional view of a semiconductor structure of the second funnel-shaped STT MRAM device with the DMTJ after forming a top contact in accordance with an embodiment of the present invention.

FIG. 9 is a cross-sectional view of semiconductor structure 900 after completion of top contact 66 in accordance with an embodiment of the present invention. The processes of depositing top contact, etching top contact 66, depositing ILD 70 and planarizing a top surface of semiconductor structure 900 with CMP were previously described with reference to FIGS. 5-7. In FIG. 9, top contact 66 can be formed around reference layer 89 using known semiconductor processes for metal contact formation. For example, a metal layer can be deposited, the metal layer patterned and etched to form top contact 66. In various embodiments, top contact 66 is a bit line extending perpendicularly out of the plane of FIG. 9. The etch process of top contact 66 can finish at a level below the bottom surface of metal pillar 10. When this occurs, the horizontal portions of the DMTJ (e.g., reference layer 81, tunnel barrier 83, free layer 85, tunnel barrier 87 and reference layer 89) that are not adjacent to metal pillar 10 can be removed. Using known semiconductor processes, a second layer of interlayer dielectric material (i.e., ILD 70) can be deposited over the top surfaces of semiconductor structure 900. ILD 70 can surround top contact 66, be on the exposed sides of reference layer 89 of the DMTJ, and on an exposed portion of ILD 9. ILD 70 planarized by CMP until reaching the top surface of top contact 66 as previously described with respect to FIG. 7. Top contact 66 can function as a bit line in the funnel-like STT MRAM device with a DMTJ.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure of a funnel-shaped spin transfer torque (STT) magnetoresistive random-access memory (MRAM) device with a dual magnetic tunnel junction, the semiconductor structure comprising:
   a metal pillar on a connection to a semiconductor device;
   a first reference layer on the metal pillar and on a portion of a first interlayer dielectric adjacent to the metal pillar;
   a first tunnel barrier on the first reference layer;
   a free layer on the first tunnel barrier layer, wherein the free layer is a synthetic antiferromagnet (SAF) comprising a first free layer, a non-magnetic spacer, and a second free layer, and wherein the first free layer and the second free layer are comprised of magnetic bilayers to make a SAF with strong anti-ferromagnetic coupling;
   a second tunnel barrier on the free layer; and
   a second reference layer on the second tunnel barrier, wherein a first portion, or vertical portion, of the first reference layer, the free layer, and the second reference layer on a side wall of the metal pillar is thicker than a second portion, or horizontal portion, of the first reference layer, the free layer, and the second reference layer on a horizontal surface above a semiconductor wafer surface and on a horizontal surface above a flat top of the metal pillar, wherein a thickness of the free layer on the side wall of the metal pillar ranges from 15 to 25 angstroms, and wherein a thickness of the free layer on the horizontal surface above the flat top of the metal pillar ranges from 3 to 5 angstroms.

2. The semiconductor structure of claim 1, wherein the first portion of the first reference layer, the free layer, and the second reference layer on the side wall of the metal pillar is two times or more thicker than the second portion of the first reference layer, the free layer, and the second reference layer on the horizontal surface above the semiconductor wafer surface and on the horizontal surface above the flat top of the metal pillar.

3. The semiconductor structure of claim 1, the second portion of the first reference layer, the free layer, and the second reference layer deposited on the horizontal surface above the semiconductor wafer surface and on the horizontal surface above the flat top of the metal pillar are electrically nonconductive and nonferromagnetic.

4. The semiconductor structure of claim 1, wherein a thickness of one or more deposited layers of the free layer, on horizontal portions of the first tunnel barrier, and a thickness of one or more deposited layers of the free layer, on horizontal portions of the second tunnel barrier, are greater than a portion of the first tunnel barrier and a portion of the second tunnel barrier deposited on side walls of the metal pillar.

5. The semiconductor structure of claim 1, wherein the first reference layer, the first tunnel barrier, the free layer, the second tunnel barrier, and the second reference layer form a dual magnetic tunnel junction in the funnel-shaped spin-transfer torque MRAM device.

6. The semiconductor structure of claim 1, further comprising:
   a contact metal over the second reference layer, wherein a second interlayer dielectric surrounds the contact metal, on exposed sides of the second reference layer, the second tunnel barrier, the free layer, the first tunnel barrier, the first reference layer, and on an exposed portion of the first interlayer dielectric.

7. The semiconductor structure of claim 6, wherein the contact metal over the second reference layer functions as a bit line.

\* \* \* \* \*